(12) United States Patent
Derhacobian et al.

(10) Patent No.: US 6,215,702 B1
(45) Date of Patent: Apr. 10, 2001

(54) METHOD OF MAINTAINING CONSTANT ERASING SPEEDS FOR NON-VOLATILE MEMORY CELLS

(75) Inventors: Narbeh Derhacobian, Belmont; Shane C. Hollmer, San Jose; Ravi S. Sunkavalli, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/504,696

(22) Filed: Feb. 16, 2000

(51) Int. Cl.$^7$ .................................................. G11C 11/34
(52) U.S. Cl. .............................. 365/185.29; 365/185.33
(58) Field of Search .......................... 365/185.33, 185.29

(56) References Cited

U.S. PATENT DOCUMENTS

| | | | |
|---|---|---|---|
| 4,173,766 | 11/1979 | Hayes | 357/23 |
| 4,569,122 | 2/1986 | Chan | 29/577 |
| 4,974,055 | 11/1990 | Haskell | 357/71 |
| 5,280,446 | 1/1994 | Ma et al. | 365/185 |
| 5,349,221 | 9/1994 | Shimoji | 257/324 |
| 5,511,026 | 4/1996 | Cleveland et al. | 365/189.09 |
| 5,521,867 | 5/1996 | Chen et al. | 365/185.33 |
| 5,561,620 | 10/1996 | Chen et al. | 365/218 |
| 5,576,991 | 11/1996 | Radjy et al. | 365/185.24 |
| 5,579,261 | 11/1996 | Radjy et al. | 365/185.33 |
| 5,598,369 | 1/1997 | Chen et al. | 365/185.27 |
| 5,635,415 | 6/1997 | Hong | 438/261 |
| 5,638,326 | 6/1997 | Hollmer et al. | 365/185.2 |
| 5,675,537 | 10/1997 | Bill et al. | 365/185.22 |
| 5,768,192 | 6/1998 | Eitan | 365/185.24 |
| 5,801,579 | 9/1998 | Le et al. | 327/537 |
| 5,805,502 | 9/1998 | Tang et al. | 365/185.29 |
| 5,814,853 | 9/1998 | Chen | 257/315 |
| 5,818,288 | 10/1998 | Le et al. | 327/536 |
| 5,821,800 | 10/1998 | Le et al. | 327/333 |

(List continued on next page.)

FOREIGN PATENT DOCUMENTS 2 157 489 10/1985 (GB).
WO 99/07000 2/1999 (WO).

OTHER PUBLICATIONS

T.Y. Chan et al., "a True Single–Transistor Oxide–Nitride–Oxide EEPROM Device," IEEE Electron Device Letters, vol. EDL–8, No. 3, Mar. 1987, pp. 93–95.

U.S. application No. 09/504,696, Derhacobian et al., filed Feb. 16, 2000.

U.S. application No. 09/505,259, Sunkavalli, filed Feb. 16, 2000.

U.S. application No. 60/182,752, Wang et al., filed Feb. 16, 2000.

U.S. application No. 60/182,753, Wang et al., filed Feb. 16, 2000.

U.S. application No. 60/182,821, Wang et al., filed Feb. 16, 2000.

U.S. application No. 60/185,727, Thurgate et al., filed Feb. 29, 2000.

Primary Examiner—David Nelms
Assistant Examiner—M. Tran
(74) Attorney, Agent, or Firm—Brinks Hofer Gilson & Lione

(57) ABSTRACT

A method of erasing a memory cell that has a first region and a second region with a channel therebetween and a gate above the channel, and a charge trapping region that contains an initial amount of charge. The method includes applying a first cycle of voltages across the gate and the first region so that the first amount of charge is removed from the charge trapping region. A second amount of charge is written into the charge trapping region and subsequently a second cycle of one or more voltages is applied across the gate and the first region so that the second amount of charge is removed from the charge trapping region, wherein the initial applied voltage of the second cycle of voltages is equal to the final applied voltage of the first cycle of voltages.

41 Claims, 5 Drawing Sheets

U.S. PATENT DOCUMENTS

| | | |
|---|---|---|
| 5,825,686 | 10/1998 | Schmitt-Landsiedel et al. ............................................................. 365/185.03 |
| 5,828,601 | 10/1998 | Hollmer et al. ................... 365/185.2 |
| 5,844,840 | 12/1998 | Le et al. ........................... 365/185.23 |
| 5,852,576 | 12/1998 | Le et al. ........................... 365/185.33 |
| 5,856,946 | 1/1999 | Chan et al. ...................... 365/185.19 |
| 5,875,130 | 2/1999 | Haddad et al. .................. 365/185.33 |
| 5,901,090 | 5/1999 | Haddad et al. .................. 365/185.29 |
| 5,907,781 | 5/1999 | Chen et al. ........................... 438/303 |
| 5,909,396 | 6/1999 | Le et al. ........................... 365/185.23 |
| 5,912,489 | 6/1999 | Chen et al. ........................... 257/321 |
| 5,939,928 | 8/1999 | Le et al. ............................... 327/390 |
| 5,973,546 | 10/1999 | Le et al. ............................... 327/536 |
| 5,978,266 | 11/1999 | Chen et al. ..................... 365/185.17 |
| 5,978,267 | 11/1999 | Chen et al. ..................... 365/185.17 |
| 5,981,995 | 11/1999 | Selcuk ................................... 257/330 |
| 5,991,202 | 11/1999 | Derhacobian et al. ......... 365/185.19 |
| 5,995,417 | 11/1999 | Chen et al. ...................... 365/185.29 |
| 5,999,452 | 12/1999 | Chen et al. ...................... 365/185.17 |
| 6,005,804 | 12/1999 | Hollmer et al. ................. 365/185.17 |
| 6,009,014 | 12/1999 | Hollmer et al. ................. 365/185.22 |
| 6,011,721 | 1/2000 | Sunkavalli ...................... 365/185.22 |
| 6,011,725 * | 1/2000 | Eitan ............................... 365/185.33 |
| 6,015,740 | 1/2000 | Milic-Strkalj ........................ 438/300 |
| 6,025,240 | 2/2000 | Chan et al. ........................... 438/303 |
| 6,052,310 | 4/2000 | Sunkavalli ...................... 365/185.29 |
| 6,055,366 | 4/2000 | Le et al. ........................... 395/500.06 |
| 6,072,725 | 6/2000 | Le et al. ........................... 365/185.29 |
| 6,081,455 | 6/2000 | Le et al. ........................... 365/185.23 |

\* cited by examiner

| CYCLE N | | |
|---|---|---|
| PULSE # | $V_D$ (volts) | $V_G$ (volts) |
| 1 | 6 | -1 |
| 2 | 6 | -2 |
| 3 | 6 | -3 |
| 4 | 6 | -4 |

| CYCLE N+1 | | |
|---|---|---|
| PULSE # | $V_D$ (volts) | $V_G$ (volts) |
| 1 | 6 | -4 |

METHOD OF MAINTAINING CONSTANT ERASING SPEEDS FOR NON-VOLATILE MEMORY CELLS

BACKGROUND OF THE INVENTION

1. Field of the Invention

The present invention relates to the field of non-volatile memory devices. More particularly, the invention relates to a method of erasing multi-bit flash electrically erasable programmable read only memory (EEPROM) cells that utilize the phenomena of hot electron injection to trap charge within a trapping dielectric material within the gate.

2. Discussion of Related Art

Memory devices for non-volatile storage of information are currently in widespread use today, being used in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

Semiconductor EEPROM devices involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed (i.e., written) and erased electrically but with the additional ability of erasing all memory cells at once, hence the term flash EEPROM.

An example of a single transistor Oxide-Nitrogen-Oxide (ONO) EEPROM device is disclosed in the technical article entitled "A True Single-Transistor Oxide-Nitride-Oxide EEPROM Device," T. Y. Chan, K. K. Young and Chenming Hu, IEEE Electron Device Letters, March 1987. The memory cell is programmed by hot electron injection and the injected charges are stored in the oxide-nitride-oxide (ONO) layer of the device. This article teaches programming and reading in the forward direction. Thus, a wider charge trapping region is required to achieve a sufficiently large difference in threshold voltages between programming and reading. This, however, makes it much more difficult to erase the device.

An attempt to improve the erasure of such ONO EEPROM devices is disclosed in both U.S. Pat. No. 5,768,192 and PCT patent application publication WO 99/07000, the contents of which are hereby incorporated herein by reference. In those disclosed devices, a cell is erased by applying a constant negative voltage to the gate over a plurality of cycles. However, the number of cycles and time to erase the memory cell can become large. Furthermore, the memory cell may become degraded should the number of cycles needed to erase the cell becomes too large. The slowing down of the erase speed is due to the trapping of electrons in the oxide layers or charge spill over into the nitride layer.

SUMMARY OF THE INVENTION

One aspect of the invention regards a method of erasing a memory cell that has a first region and a second region with a channel therebetween and a gate above the channel, and a charge trapping region that contains a first amount of charge. The method includes applying a first voltage across the gate and the first region so that a first portion of the first amount of charge is removed from the charge trapping region and subsequently applying a second voltage across the gate and the first region so that substantially all remaining portions of the first amount of charge are removed from the charge trapping region, wherein the second voltage is different than the first voltage. A second amount of charge is written into the charge trapping region and a third voltage is applied across the gate and the first region so that that a first portion of the second amount of charge is removed from the charge trapping region, wherein the third voltage is greater than or equal to the second voltage.

A second aspect of the present invention regards a method of erasing a memory cell that has a first region and a second region with a channel therebetween and a gate above the channel, and a charge trapping region that contains a first amount of charge. The method includes applying a first cycle of voltages across the gate and the first region so that the first amount of charge is removed from the charge trapping region. A second amount of charge is written into the charge trapping region and subsequently a second cycle of one or more voltages is applied across the gate and the first region so that the second amount of charge is removed from the charge trapping region, wherein the initial applied voltage of the second cycle of voltages is equal to the final applied voltage of the first cycle.

Each of the above aspects of the present invention provides the advantage of maintaining a more constant erase speed.

The present invention, together with attendant objects and advantages, will be best understood with reference to the detailed description below in connection with the attached drawings.

DETAILED DESCRIPTION OF THE INVENTION

Figure 1:
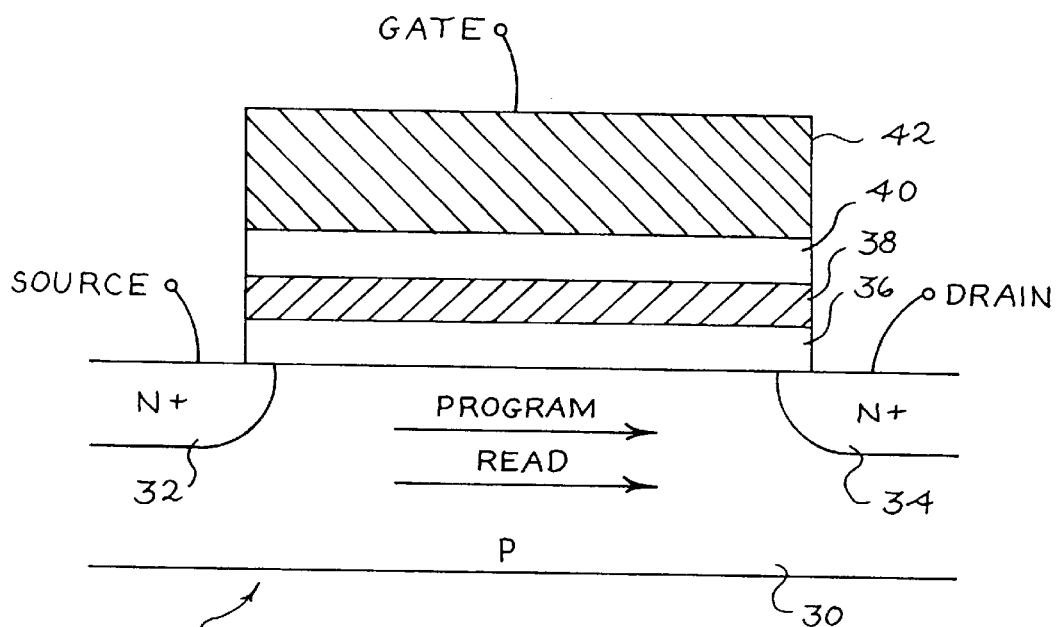
FIG. 1 illustrates a sectional view of a single bit flash EEPROM cell of the prior art utilizing Oxide-Nitride-Oxide (ONO) as the gate dielectric.

The structure of a two bit flash EEPROM cell that employs the method of erasure of the present invention can best be understood with an understanding of how single bit charge trapping dielectric flash EEPROM memory cells are constructed, programmed and read. For example, a conventional ONO EEPROM memory cell is shown in FIG. 1 and is disclosed in the technical article entitled "A True Single-Transistor Oxide-Nitride-Oxide EEPROM Device," TX. Chan, K. K. Young and Chenming Hu, IEEE Electron Device Letters, March 1987, incorporated herein by reference. The memory cell 41 comprises a P-type silicon substrate 30, two PN junctions between N+ source and drain regions 32, 34 and P type substrate 30, a non-conducting nitride layer 38 sandwiched between the two oxide layers 36, 40 and a polycrystalline conducting layer 42.

To program or write the memory cell 41, voltages are applied to the drain 34 and the gate 42 and the source 32 is grounded. For example, 10V is applied to the gate and 9V is applied to the drain. These voltages generate a vertical and lateral electric field along the length of the channel from the source to the drain. This electric field causes electrons to be drawn off the source and begin accelerating toward the drain. As they move along the length of the channel, they gain energy. If they gain enough energy, they are able to jump over the potential barrier of the oxide layer 36 into the silicon nitride layer 38 and become trapped. The probability of this occurring is a maximum in the region of the gate next to the drain 34 because it is near the drain that the electrons gain the most energy. These accelerated electrons are termed hot electrons and once injected into the nitride layer 38 they become trapped and remain stored there. The trapped electrons cannot spread through the nitride layer 38 because of the low conductivity of the nitride layer 38 and the low lateral electric field in the nitride layer. Thus, the trapped charge remains in a localized trapping region in the nitride layer 38 typically located close to the drain 34.

In order to achieve an effective delta in threshold voltage between the unprogrammed and the programmed state of each cell, the charge trapping region of prior art flash EEPROM cells must be made fairly wide. Thus, electrons are trapped in areas far from the drain which directly affects the effectiveness of the erase. In some cases, the device cannot be erased at all because the charge trapping region was programmed too wide.

In memory cells constructed using a conductive floating gate, the charge that gets injected into the gate is distributed equally across the entire gate. The threshold voltage of the entire gate increases as more and more charge is injected into the gate. The threshold voltage increases because the electrons that become stored in the gate screen the gate voltage from the channel.

In devices with low conductivity or non conductive floating gates like the embodiment shown in FIG. 1, the injection of hot electrons into the silicon nitride layer causes the gate threshold voltage to increase only in the localized trapping region. This is in contrast to the conductive floating gate memory cells of EPROMs and EEPROMs wherein the gate threshold voltage of the entire channel rises as programming time increases. In both conductive and non conductive floating gate memory cell designs, an increase in the gate threshold voltage causes the current flowing through the channel to decrease for a given gate voltage. This reduces programming efficiency by lengthening the programming time. However, due to the localized electron trapping in the non conductive floating gate memory cell design, the programming time is reduced less than with the conductive floating gate memory cell design. The technique of programming flash EEPROM memory cells with either conductive or low conductivity or non conductive floating gates is well known in the art and is currently used to program EEPROM and flash EEPROM memory cells.

The conventional technique of reading both prior art conductive floating gate and non conductive localized trapping gate EEPROM or flash EEPROM memory cells is to apply read voltages to the gate and drain and to ground the source. This is similar to the method of programming with the difference being that lower level voltages are applied during reading than during programming. Since the floating gate is conductive, the trapped charge is distributed evenly throughout the entire floating conductor. In a programmed device, the threshold is therefore high for the entire channel and the process of reading becomes symmetrical. It makes no difference whether voltage is applied to the drain and the source is grounded or vice versa. A similar process is also used to read prior art non conductive localized gate flash EEPROM devices.

The process of programming EPROM and EEPROM memory devices typically includes writing followed by reading. For instance, a short programming pulse is applied to the device followed by a read. The read is actually used to effectively measure the gate threshold voltage. By convention, the gate threshold voltage is measured by applying a voltage to the drain and a separate voltage to the gate, with the voltage on the gate being increased from zero while the channel current flowing from drain to source is measured. The gate voltage that provides 1 pA of channel current is termed the threshold voltage.

Typically, programming pulses (i.e., write pulses) are followed by read cycles wherein the read is performed in the same direction that the programming pulse is applied. This is termed symmetrical programming and reading. Programming stops when the gate threshold voltage has reached a certain predetermined point (i.e., the channel current is reduced to a sufficiently low level). This point is chosen to ensure that a '0' bit can be distinguished from a '1' bit and that a certain data retention time has been achieved.

Figure 2:
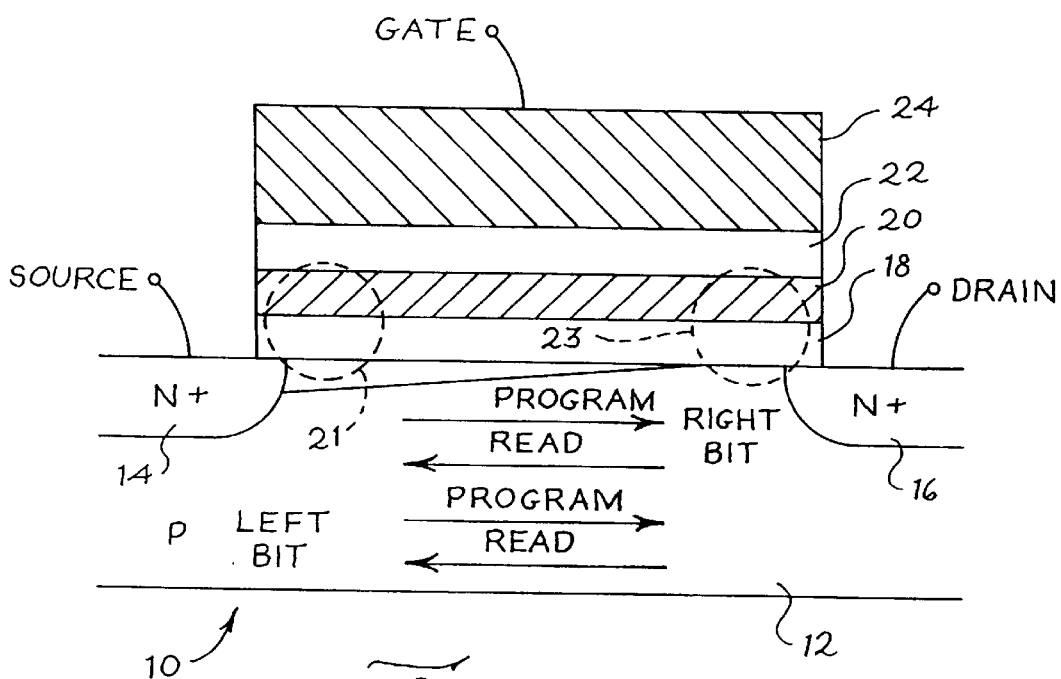
FIG. 2 illustrates a sectional view of a two bit flash EEPROM cell constructed in accordance with an embodiment of the present invention utilizing ONO as the gate dielectric.

An embodiment of a two bit flash EEPROM cell that can utilize a method of erasure in accordance with an embodiment of the present invention is shown in FIG. 2. The flash EEPROM memory cell 10 includes a P-type substrate 12 having two buried PN junctions, one being between the source 14 and substrate 12, termed the left junction and the other being between the drain 16 and the substrate 12, termed the right junction. Above the channel is a layer of silicon dioxide 18 that has a thickness that ranges between approximately 60 to 100 Angstroms, and which forms an electrical isolation layer over the channel. On top of the silicon dioxide layer 18 is a charge trapping layer 20 that has a thickness ranging from 20 to 100 Angstroms thick and preferably is comprised of silicon nitride, $Si_3N_4$. The charge trapping layer can be constructed using silicon nitride, silicon dioxide with buried polysilicon islands or implanted oxide, for example or it can be made of an oxide implanted with arsenic, for example. The hot electrons are trapped as they are injected into the charge trapping layer so that the charge trapping layer serves as the memory retention layer. The thickness of layer 18 is chosen to be in excess of 50 angstrom to prevent electrons from tunneling through the oxide and leaving charge trapping layer 20 during the operation of the cell. Thus the lifetime of the cell of this invention is greatly extended relative to prior art MNOS devices. The memory cell 10 is capable of storing two bits of data, a right bit represented by the dashed circle 23 and a left bit represented by the dashed circle 21.

It is important to note that the two bit memory cell is a symmetrical device. For example, the left junction serves as the source terminal and the right junction serves as the drain terminal for the right bit. Similarly, for the left bit, the right junction serves as the source terminal and the left junction serves as the drain terminal. Thus, the terms left, or first junction and right or second junction are used herein rather than source and drain. When the distinction between left and right bits is not crucial to the particular discussion, the terms source and drain are utilized. However, it should be understood that the source and drain terminals for the second bit are reversed compared to the source and drain terminals for the first bit.

Another layer of silicon dioxide 22 is formed over the charge trapping layer, (i.e., silicon nitride layer), and has a thickness that ranges between approximately 60 to 100 Angstroms thick. The silicon dioxide layer 22 functions to electrically isolate a conductive gate 24 formed over the silicon dioxide layer 22 from charge trapping layer 20. The thickness of gate 24 is approximately 4,000 Angstroms. Gate 24 can be constructed from polycrystalline silicon, commonly known as polysilicon.

Figure 3:
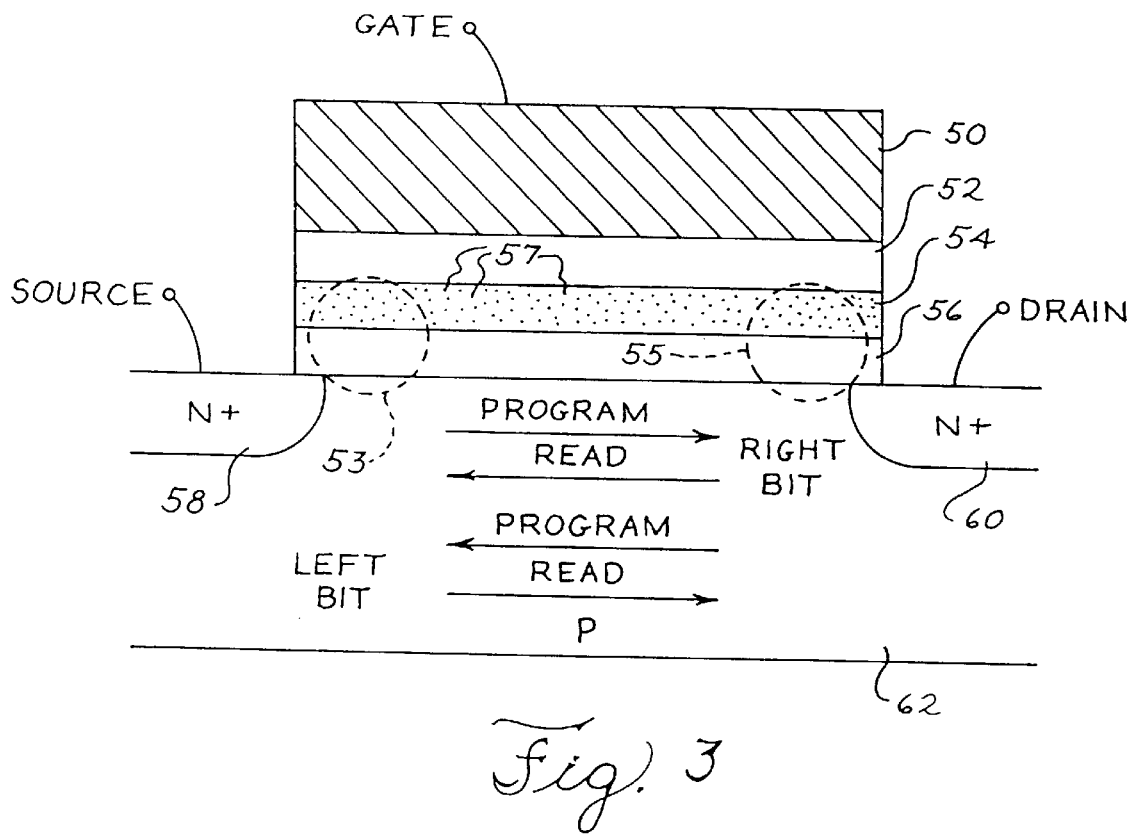
FIG. 3 illustrates a sectional view of a two bit flash EEPROM cell constructed in accordance with an embodiment of the present invention utilizing a silicon rich silicon dioxide with buried polysilicon islands as the gate dielectric.

Charge trapping dielectric materials other than nitride may also be suitable for use as the asymmetric charge trapping medium. One such material is silicon dioxide with buried polysilicon islands. The silicon dioxide with polysilicon islands is sandwiched between two layers of oxide in similar fashion to the construction of the ONO memory cell in FIG. 2. A sectional view of such a two bit flash EEPROM cell is shown in FIG. 3 where there is a silicon rich silicon dioxide layer 54 with buried polysilicon islands 57 as the gate dielectric is illustrated in FIG. 3. A P-type substrate 62 has buried N+ source 58 and N+ drain 60 regions. The silicon dioxide 54 with buried polysilicon islands 57 is sandwiched between two layers of silicon dioxide 52, 56. Covering oxide layer 52 is polysilicon gate 50. Gate 50 is typically heavily doped with an N-type impurity such as phosphorus in the $10^{19}$ to $10^{20}$ atom/cc range. Similar to the two bit memory cell of FIG. 2, the memory cell of FIG. 3 is capable of storing two data bits, a right bit represented by the dashed circle 55 and a left bit represented by the dashed circle 53. The operation of the memory cell of FIG. 3 is similar to that of the memory cell illustrated in FIG. 2 with programming and reading occurring in opposite directions for each bit.

Alternatively, the charge trapping dielectric can be constructed by implanting an impurity, such as arsenic, into a middle layer 54 of silicon dioxide deposited on top of the bottom oxide 56.

Rather than performing symmetrical programming and reading, the flash EEPROM memory cell of FIG. 2 is programmed and read asymmetrically rather than symmetrically as with the cell of FIG. 1. This means that programming and reading occur in opposite directions as denoted by the oppositely pointing arrows labeled PROGRAM and READ for each bit (i.e. the left bit and the right bit) in FIG. 2. Thus, programming is performed in what is termed the forward direction and reading is performed in what is termed the opposite or reverse direction.

It is noted that throughout the discussion of the EEPROM memory cell of the present invention presented below, the voltage levels discussed in connection therewith are assumed to be independent of the power supply voltage. Thus, the power supply voltages supplied to the chip embodying the EEPROM memory device may vary while the voltages applied to the gate, drain and source thereof will be supplied from regulated voltage sources.

As previously mentioned, the flash EEPROM memory cell 10 of FIG. 2 is programmed similarly to the prior art flash EEPROM memory cell of FIG. 1. Voltages are applied to the gate 24 and drain 16 creating vertical and lateral electrical fields which accelerate electrons from the source 14 along the length of the channel. As the electrons move along the channel some of them gain sufficient energy to jump over the potential barrier of the bottom silicon dioxide layer 18 and become trapped in the silicon nitride layer 20. For the right bit, for example, the electron trapping occurs in a region near the drain 16 indicated by the dashed circle 23 in FIG. 2. Thus, the trapped charge is self-aligned to the junction between the drain 16 and the substrate. Electrons are trapped in the portion of nitride layer 20 near but above and self-aligned with the drain region 16 because the electric fields are the strongest there. Thus, the electrons have a maximum probability of being sufficiently energized to jump the potential barrier of the silicon dioxide layer 18 and become trapped in the nitride layer 20 near the drain 16. The threshold voltage of the portion of the channel between the source 14 and drain 16 under the region of trapped charge increases as more electrons are injected into the nitride layer 20.

It is important to note that in order to be able to subsequently erase memory device 10 effectively, the programming time period must be limited. As the device continues to be programmed, the width of the charge trapping region increases. If programming continues past a certain point the charge trapping region becomes too wide whereby erasing is ineffective in removing trapped charge from the nitride layer 20.

However, by reading in the reverse direction an amplification of the effect of the trapped charge injected into the nitride layer results and which leads to dramatically shortened programming times. Reading in the reverse direction permits a much narrower charge trapping region. This in turn greatly increases the erase efficiency since fewer electrons need to be removed to erase the device. In addition, the trapped electrons are stored in a narrower region near the drain also improving the effectiveness of the erase.

Figure 4A:
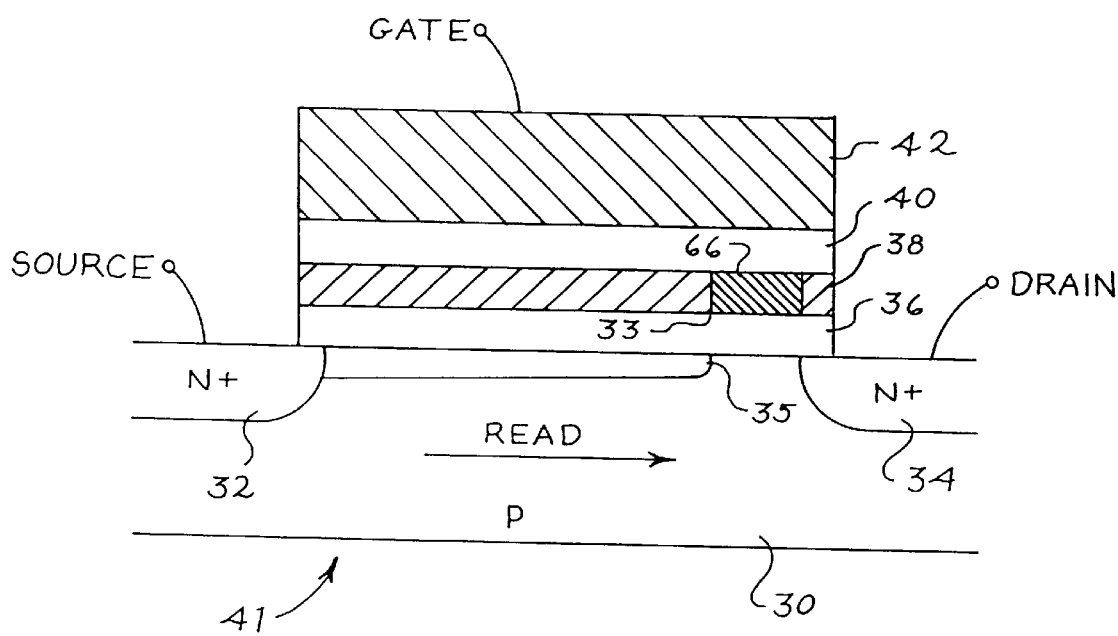
FIG. 4A illustrates a sectional view of a flash EEPROM cell of the prior art showing the area of charge trapping under the gate.
Figure 4B:
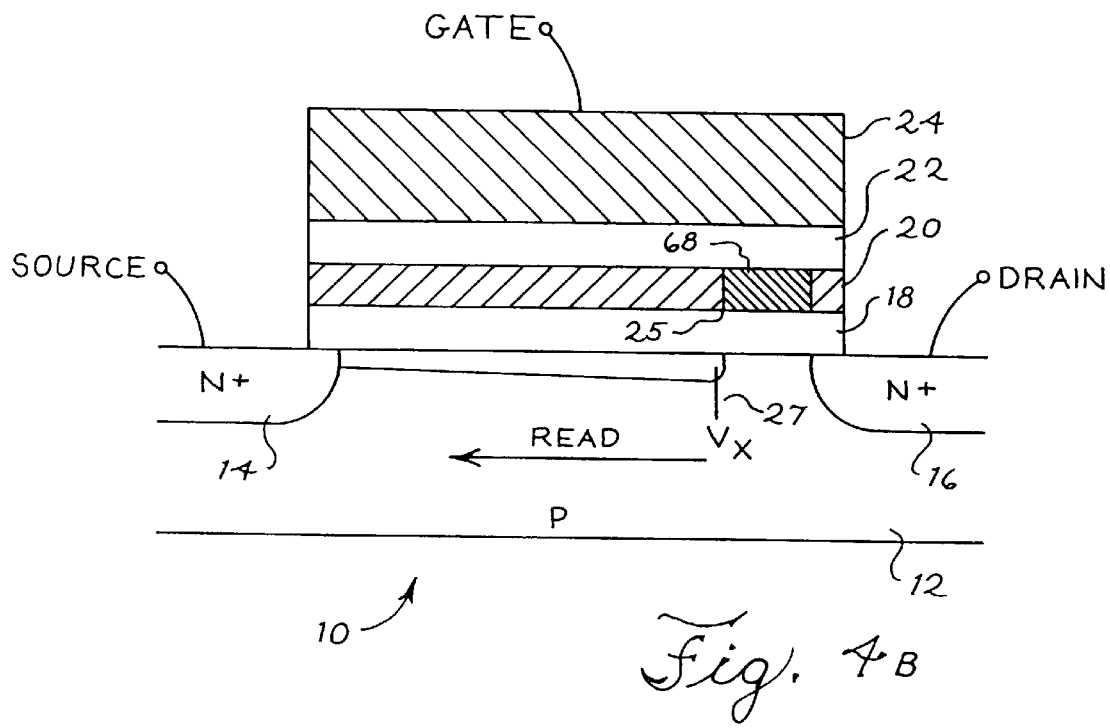
FIG. 4B illustrates a sectional view of a flash EEPROM cell constructed in accordance with an embodiment of the present invention showing the area of charge trapping under the gate.

A description of what occurs during programming is presented first followed by what occurs during reading. Note that the description that follows also pertains to the memory cell of FIG. 3 comprising the silicon dioxide layer 54 having buried polysilicon islands 57 substituting for the nitride layer 20 of FIG. 2. During programming, hot electrons are injected into the nitride layer 20, as described above. Since the nitride 20 is a nonconductor, the trapped charge remains localized to the region near the drain 34 (FIG. 4A) or 16 (FIG. 4B). The region of trapped charge is indicated by the cross hatched area 66 in FIG. 4A and by the cross hatched area 68 in FIG. 4B. Thus, the threshold voltage rises, for example, to approximately 4 V, only in the portion of the channel under the trapped charge. The threshold voltage of the remainder of the channel under the gate remains at, for example, approximately 1 V.

In order to read the flash EEPROM memory cell 10 (FIG. 4B) in the reverse direction, i.e., the direction opposite that of programming, voltages are applied to the source 14 and the gate 24 and the drain 16 is grounded. Similar to the prior art memory device of FIG. 4A, the memory device of FIG. 4B is programmed in the forward direction by injecting hot electrons into region 68 of the nitride layer 20. Since nitride 20 is a nonconductor, the trapped charge remains localized to the region near the drain, for the right bit, for example. The left bit is similar except that source and drain functionality are reversed. The region of trapped charge is indicated by the cross hatched area 68 in FIG. 4B. Thus, the threshold voltage rises, for example, to approximately 4V only in the portion of the channel under the trapped charge 68. The threshold voltage of the remainder of the channel remains at, for example, approximately 1 V.

To read the right bit of the device of FIG. 4B in the reverse direction, a voltage is applied to the source 14 and the gate 24, for example 2V and 3V, respectively, and the drain 16 is grounded. A major difference between reading in the forward direction and reading in the reverse direction is that when reading in the reverse direction, the gate voltage required to put the channel of the memory device into inversion increases significantly. For the same applied gate voltage of 3V, for example, there will be no inversion but rather the channel of the memory device will be in depletion. The reason for this is that the channel region next to the drain 16 (which functions as the source in read) is not inverted due to the electron charge in region 68 of the nitride 20. The channel adjacent the source 14 (which functions as the drain in read) is not inverted because 2V is applied to the source 14 and the channel, to be inverted, must be inverted relative to 2 V. In the case of reading in the reverse direction, in order to sustain a higher voltage in the channel, a much wider depletion region must be sustained. A wider depletion region translates to more fixed charge that must be compensated for before there can be inversion. When reading in the reverse direction, to achieve a voltage drop across the charge trapping region 66 of the prior art memory device shown in FIG. 4A similar to the voltage drop achieved when reading the same device in the forward direction, a higher gate voltage is required, for example, 4 V. A much higher gate voltage is required to pin the voltage in the channel to a higher voltage, i.e., the 2V that is applied to the source terminal rather than ground. In other words, the present invention recognizes and takes advantage of the fact that for the same magnitude potential across the drain and the source, the voltage across the portion of the channel under the trapped charge region 68 (FIG. 4B) is significantly reduced when reading occurs in a reverse direction to writing (programming) directly resulting in less punch through and greater impact of the programming charge injected in region 68 of the nitride layer 20 (FIG. 4B) on the threshold voltage of the transistor. As an example, for the threshold voltage $V_T$ equaling 3v during reverse read, a programming time of approximately 2 microseconds is required which is three orders of magnitude less than the programming time required for the same threshold voltage when the cell is read in the forward direction.

By reading in the reverse direction, the amount of charge required to be stored on the nitride to achieve the same increase in threshold voltage in a programmed cell read in the forward direction is reduced in some cases by a factor of two or three. Accordingly, the internal electric fields generated by the charge in the nitride when the memory cell is to be read in the reverse direction are much less than the internal electric fields associated with the charge stored on the nitride when the memory cell is to be read in the forward direction. Consequently electron hopping is exponentially reduced and the small amount of charge stored in the nitride does not disperse laterally through the nitride due to the internally self generated electric fields even during retention bake. Consequently, the memory cell of FIG. 2 does not suffer the degradation in performance and reliability of prior art ONO memory cells like those of FIG. 1 which are programmed and read in the same direction.

In programming the two bit cell, each bit, i.e., the left and right bit, is treated as if the device was a single bit device. For the right bit, for example, programming voltages are applied to the gate 24 and drain 16 and hot electrons are injected into and trapped in the charge trapping layer 20 in the region near the drain defined by the dashed circle 23. Correspondingly, the threshold voltage of the portion of the channel under the trapped charge increases as more and more electrons are injected in the nitride layer. The programming of the right bit is represented in FIG. 2 by the right-pointing arrow labeled 'PROGRAM.' This arrow represents the flow of electrons to the right during programming of the right bit.

Similarly, the left bit is programmed by applying programming voltages to the gate 24 and source 14, which now functions as the drain for the left bit. Hot electrons are injected into and trapped in the charge trapping layer 20 in the region defined by the dashed circle 21. The threshold voltage of the portion of the channel under the trapped charge comprising the left bit increases as more and more electrons are injected into the nitride layer. The programming of the left bit is represented in FIG. 2 by the left-pointing arrow labeled 'PROGRAM.' This arrow represents the flow of electrons to the left during programming of the left bit.

The threshold voltage for a programmed left bit will be relatively low compared to the threshold voltage for the right bit and thus the state of the right bit can be read without interference from the left bit. During programming of the right bit, the unprogrammed left bit remains unprogrammed.

Programming the right bit does not affect the unprogrammed left bit. During a second pass or phase, the left bit is programmed and the right bit remains programmed and can still be read. The gate voltage during programming is sufficiently high (typically around 10V) that the programmed right bit does not interfere with the programming of the left bit except to increase somewhat the time required to reach a given threshold voltage relative to the time required to reach the same threshold voltage for the right bit when the right bit is programmed. In addition, the right bit can be programmed through during programming of the left bit. Further, the programming of the left bit does not disturb the programmed right bit. This is possible because program through (i.e. the programming of the one bit substantially without interference from the other bit when the other bit is programmed) and read through (i.e. the reading of one bit without interference from the other bit when the other bit is programmed) occurs through both the left and the right bits.

Program through and read through are possible due to the relatively low gate voltages required to turn on each programmed bit when read in the forward direction as occurs when the other bit is read in the reverse direction. Another way to look at this is that a narrow charge trapping region permits punch through to be more effective. Thus the small amount of charge 68 trapped on the right edge of charge trapping layer 20 (FIG. 5) and self-aligned with the junction between region 16 and the substrate 12 and a comparable amount of charge 70 trapped on the left edge of charge trapping layer 20 and self-aligned with the junction between region 14 and the substrate 12 cause a narrow charge trapping region to be formed at both the right side and the left side of charge trapping layer 20 which is easy to be punched through when the bit is read in the forward direction. Thus when left bit 70 (the charge trapping region 70 is referred to as a bit because the presence or absence of charge in region 70 would represent either a zero or a one) is read in the forward direction, bit 68 is being read in the reverse direction. The punch-through under charge trap region 70 is quite easily achieved with a low gate voltage thereby allowing the charge trapped in bit 68 to control the state of the signal read out of the device. Thus for equal amounts of charge trapped in regions 70 and 68, reading a bit in the reverse direction results in the opposite bit having no effect on the state of the signal being read.

Another reason that the bit not being programmed is not disturbed is that the programming voltage is not being applied to the drain for the bit previously programmed. When programming the other bit, the programming voltage is applied to the drain for the bit on the other side of the device.

As discussed earlier, the programming duration must be limited for each bit in order the other bit can still be read. For example, in the case when the right bit is programmed, i.e., a logic '0', and the left bit is not programmed, i.e., a logic '1', if the right bit was programmed for too long a time then when the left bit is read, there may be insufficient current for the sense amps to detect a logic '1' because the channel is not sufficiently conductive. In other words, if the right bit is programmed too long, a left logic '1' bit becomes slower, i.e., takes longer to read due to lower channel current, or, in the worst case, may appear to be a logic '0' because the over-programmed right bit prevents the left bit from being read. Thus, a window exists in the programming time within which a logic '0' bit must fall. One of the variable parameters is the voltage that is applied to the functional drain region during read. As the drain voltage is increased, a longer programming time, i.e., longer area of trapped charge, is required in order to avoid punch through. Thus, a longer trapping region is equivalent to increasing the programming time. The upper limit of the programming time for the window is the programming time such that a forward read does not change the read current by more than a predetermined percentage compared to the read current for a reverse read. Preferably, the percentage change to the read current should be limited to 10%. This percentage, although not arbitrary, can be optimized according to the design goals of the chip designer. For example, a designer may wish to have three orders of magnitude margin between the threshold voltage of a forward read and the threshold for a reverse read. To achieve this, the gate voltage, drain voltage and implant level are all adjusted accordingly to determine a maximum programming time.

The effect of programming one of the bits is that both programming and reading for the second bit is slowed somewhat. The second bit can be programmed as long as the gate voltage during programming is higher than the threshold voltage of the channel with the first bit programmed and sufficient voltage is placed on the drain. The channel resistance, however, is raised due to the programming of the first bit. As long as programming parameters are tuned properly, the higher channel resistance does not prevent the second bit from being programmed and read. The higher channel resistance, however, does cause programming and reading of the second bit to take longer.

Figure 5:
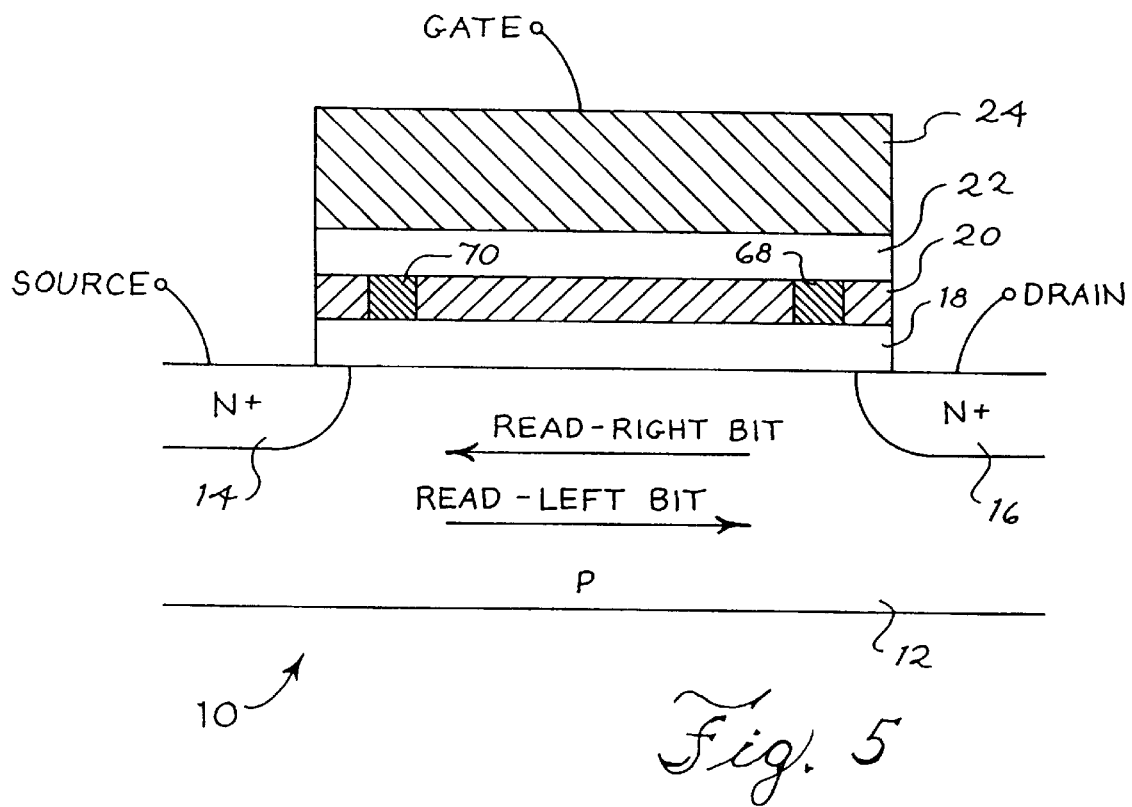
FIG. 5 is a sectional view of a two bit EEPROM cell constructed in accordance with an embodiment of the present invention showing the area of charge trapping under the gate for both the right and the left bus.

Reading the two bit cell of FIG. 5, as in programming, each bit is treated as if the device was a single bit device. The area of trapping for the right bit is reference 68 and that of the left bit is referenced 70. Also shown in FIG. 5 are two arrows labeled 'READ', one pointed in the left direction indicating the direction for reading of the right bit and one pointed in the right direction indicating the direction for reading of the left bit.

The right bit is read in the reverse direction by applying read voltages to the source 14 and the gate 24 and grounding the drain 16. For example, a gate voltage of 3V and a source voltage of 2V is applied. The resulting voltage in the channel $V_X$ will be something less than two volts. Similarly, to read the left bit in the reverse direction, read voltages are applied to the gate 234 and to the drain 16 and the source 14 is grounded, e.g., 3V on the gate and 2V on the drain.

Should the drain voltage $V_D$ is made too low and the first bit is programmed, insufficient voltage exists in the channel for read through to occur. In addition, the second bit to be programmed, in this case the left bit, experiences slower programming due to the increased series resistance of the channel. Even if the second bit is unprogrammed, when the drain voltage is too low and the first bit is programmed, the second bit cannot be read properly. Insufficient voltage exists in order for punch through to occur. If punch through does not occur, the second bit looks as if it is programmed whether it really is or not.

Punch through is very sensitive to the length of the trapped charge region, such as regions 68 and 70 of the structure shown in FIG. 5. Should these regions be too wide or not self-aligned with the appropriate region 16 or 14 (depending on whether the charge represents the right bit 68 or the left bit 70), then punch through would not be able to be guaranteed to occur and this concept would not work. Thus, the self-alignment of the trapped charge to the junction between region 16 and the substrate (for the trapped charge 68) and region 14 and the substrate (for the trapped charge region 70) is crucial to the functioning of this invention.

A read of the two bit memory device of the present invention falls into one of three cases: (1) neither of the two bits are programmed (2) one of the bits is programmed and the other is not or (3) both of the bits are programmed. The first case does not require a read through. The second case requires reading through the programmed bit to read the unprogrammed bit. In this case the margin is the delta between reading a single bit in the forward direction versus the reverse direction.

The third case requires read through to read both programmed bits. Programming the second bit, in fact, improves the conditions for reading the first bit. This is so because the voltage in the channel is further reduced over the case of reading a single bit. This increases the read margins between programmed and unprogrammed bits.

It is important to note that although the EEPROM cell of FIG. 5 stores two bits, support circuitry and concepts designed to work with single bit memory cells can still be used. For example, the sense amplifier circuitry needed for the two bit memory cell is basically no different than that for the single bit memory cell. In the single bit memory cell, the sense amplifier circuitry is required to distinguish between two states, the programmed and unprogrammed states. Likewise, in the two bit memory cell of FIG. 5, the sense amplifiers must also distinguish between only two states: programmed and unprogrammed. Accurately detecting multiple current levels in a memory device is a complex and difficult task to accomplish. The memory cell of FIG. 5, requires that the sense amplifiers only distinguish between two states as in the single bit memory cell. In the case when one of the bits is unprogrammed, i.e., no charge injected into charge trapping layer for that bit, a read of the other bit will be unaffected by this unprogrammed bit. On the other hand, however, in the case when one bit is programmed, a read of the other bit will be affected by this other programmed bit to some extent. Depending on various process parameters, the programmed bit may cause the channel to be less conductive. However, as long as the channel is sufficiently conductive both bits can still be programmed and read correctly.

With reference to FIG. 5, the two bit memory device of the present invention utilizes a punch through or read through technique to read one bit when the other bit is in a programmed state. In order to read, for example, the right bit 68, the read current must be able to read through or punch through the left bit 70, assuming that both the left bit and the right bit have been programmed. Thus, there is a limit on the length of the charge trapping region that can be programmed. The charge trapping region must be short enough to permit punch through of the bit not being read. If a bit is in the unprogrammed state, there is no constraint on the read current of the other bit from the unprogrammed bit.

It is important to note that when a semiconductor device is scaled, the channel lengths become shorter and short channel effects take hold. Thus, in the two bit memory cell, because each bit is stored in different areas of the transistor, short channel effects may become prevalent sooner than in the case of the single bit transistor. In order to retain the usable range of drain voltage, the two bit transistor may need to be scaled by a smaller factor.

A key concept associated with the two bit EEPROM memory cell of FIG. 5 is that for the device to operate properly, both bits must be able to be written and read. If one of the bits is programmed, a reverse read on the programmed bit must sense a high $V_T$, i.e., a '0' and a reverse read on the unprogrammed bit must sense a low $V_T$, i.e., a '1'. Thus, a reverse read on the unprogrammed bit, which is equivalent to a forward read on the programmed bit, must punch through the region of trapped charge in order to generate a high enough read current. If this does not happen, the unprogrammed bit will not be able to be read as a '1', i.e., a conductive bit.

In order to achieve this goal, a sufficient margin is generated between reading in the forward and reverse directions. In order to store two bits, there must be sufficient difference between forward read of one of the bits and reverse read of the other bit. In addition, the reverse read current for one of the bits when the other bit is and is not programmed should be sufficient to distinguish between the two bits. For example, for a gate voltage of 3V, punch through for reading in the reverse direction occurs at approximately 1V. Thus, a drain voltage of 1.6V creates a suitable safety margin ensuring that the second bit can be read when the first bit is programmed.

There are two parameters that can be used to ensure punch through of the charge trapping region. The first is the $V_G$, applied during reading and the second is the width of the charge trapping region. A low $V_G$ used during reading combined with a narrow charge trapping region makes a punch through more effective. The lower gate voltage produces a weaker vertical electric field which causes the lateral electric field to be stronger.

It is more important to use a low $V_G$ during reading in the two bit memory cell than in the single bit memory cell. In the single bit case, it only had to be ensured that the reverse read was better than the forward read, meaning that the $V_T$ of a given bit during forward reading was lower than the $V_T$ of this bit during reverse reading. In the two bit case, however, it is not enough that the $V_T$ drops in the forward case, it must drop sufficiently to be able to punch through when reading the other bit. If the delta $V_T$ between the forward and reverse read is not sufficient, one bit cannot be read when the other bit is programmed.

The mechanism used to erase the two bit flash EEPROM memory cell of FIG. 5 involves the movement of electrons as opposed to the movement of holes. For the right bit, an erase is performed by removing electrons from the charge trapping nitride region 68 either through the gate 24 via the top oxide 22 or through the drain 16 via the bottom oxide 18. For the left bit, an erase is performed by removing electrons from the charge trapping nitride region 70 either through the gate 24 via the top oxide 22 or through the source 14 via the bottom oxide 18.

Using the right bit as an example, one technique of erasing is to simultaneously apply a positive voltage potential to the gate 24 and zero potential, i.e., ground, to the drain 16 such that electron tunneling occurs from the charge trapping nitride layer 20 through the top oxide 22 to the gate 24. The right bit is erased in a similar fashion with zero potential applied to the source 14. In this case, the top oxide 22 is suitably constructed (again with a thickness of about seventy (70) Angstroms) to optimize the tunneling of electrons from the nitride charge trapping layer 20 into the gate 24 in order to facilitate the erasing of the memory cell 10. In one embodiment, the top oxide 22 has a thickness of 50 Angstroms to 80 Angstroms for a voltage on gate 24 of 10 to 18 volts.

Using the right bit as an example, a second technique of erasing the memory cell of FIG. 5 is to simultaneously apply a negative potential to the gate 24 and a positive potential to the drain 16 such that electron tunneling occurs from the charge trapping nitride layer 20 to the drain 16 via the bottom oxide 18. The left bit is erased in a similar fashion except that a positive potential is applied to the source 14 rather than the drain 16. The electron tunneling is substantially confined to a local area near the drain 16. To facilitate the erasing of the memory cell 10 using this technique, the thickness of the bottom layer 18 is suitably constructed (i.e., has a thickness of about seventy (70) Angstroms) to optimize the removal of electrons from the nitride charge trapping layer 20 into the drain 16.

Figure 6:
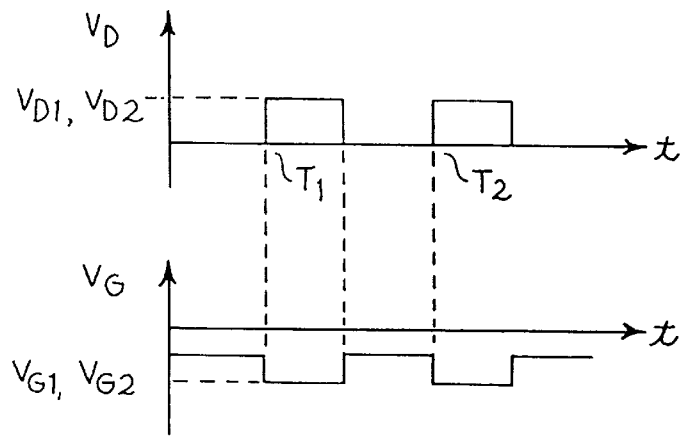
FIG. 6 is one example of a timing diagram for an erase sequence for the EEPROM cells of FIGS. 2, 3, 4B and 5.

As shown in FIG. 6, the second erasing technique involves simultaneously applying at time $T_1$ a first positive voltage pulse $V_{D1}$ to the drain and a first negative voltage pulse $V_{G1}$ at the gate. After the voltages are applied to the drain and gate, it is determined whether or not the cell has been erased. If it has not, a second positive voltage pulse $V_{D2}$ is applied to the drain and a second negative voltage pulse $V_{G2}$ at the gate at time $T_2$. Again, it is determined whether or not the cell has been erased. If it has not, the cycle is repeated until the cell is erased. As shown in FIG. 6, the magnitude of the drain voltages and the gate voltages are unchanged during each cycle. One disadvantage of this technique is that the cell becomes degraded as the number of cycles needed to erase the cell becomes larger.

Figure 7:
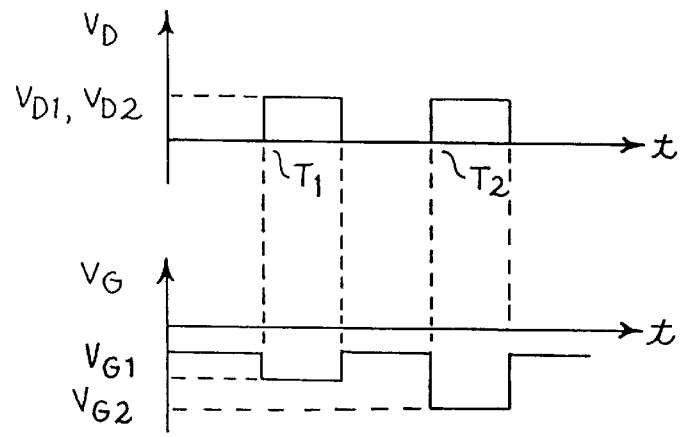
FIG. 7 is an example of a timing diagram for a second erase sequence according to the present invention for the EEPROM cells of FIGS. 2, 3, 4B and 5.

A third technique of erasing the memory cell of FIG. 5 that is related to the second technique but reduces the likelihood of cell degradation is shown in FIG. 7 and is described in U.S. patent application Ser. No. 09/504695, by Narbeh Derhacobian et al., filed concurrently with the present application and entitled "Method of Erasing Non-Volatile Memory Cells", the entire contents of which are incorporated herein by reference. Like the second erasing technique, the third erasing technique involves simultaneously applying at time $T_1$ a first positive voltage pulse $V_{D1}$ having a magnitude of approximately 3V to 6V and a pulse width ranging from 1 ms to 500 ms to the drain and a first negative voltage pulse $V_{G1}$ of approximately −1V at the gate. After the voltages are applied to the drain and gate, it is determined whether or not the cell has been erased. If the cell is erased, then the erasure technique is discontinued. If it is not, a second positive voltage pulse $V_{D2}$ is applied to the drain and a second negative voltage pulse $V_{G2}$ at the gate at time $T_2$. While the magnitude of the drain voltage remains unchanged like the second technique, the magnitude of the second negative voltage pulse at the gate is greater than the magnitude of the first negative voltage pulse so that a deeper erasure is performed in the second cycle. The magnitude of the second negative pulse has a magnitude of approximately 1.2V. If it is determined after the application of the second negative pulse that the cell is erased, then the erasing technique is discontinued. However, if the cell is found not to be erased, then the magnitude of the gate voltage will be increased once again at time $T_3$ to deepen the erase once again. Since the gate voltage is ramped in the manner described above, the cell is erased in fewer cycles than in the second technique and so the cell is less degraded when subjected to the third erasing technique than the second erasing technique.

Figure 8:
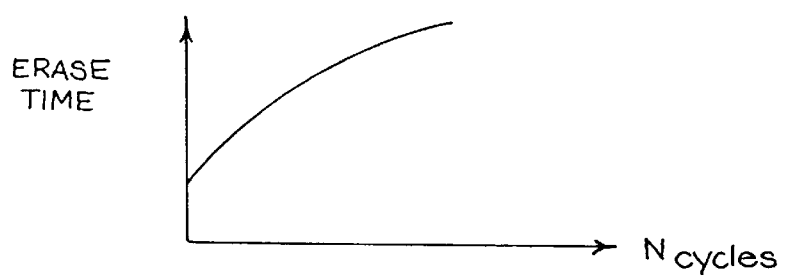
FIG. 8 shows a graph illustrating a relationship between the erase time for a cell versus the number of erase cycles for the EEPROM cells of FIGS. 2, 3, 4B and 5 when the erase sequence of FIG. 7 is employed.
Figures 9, 10:
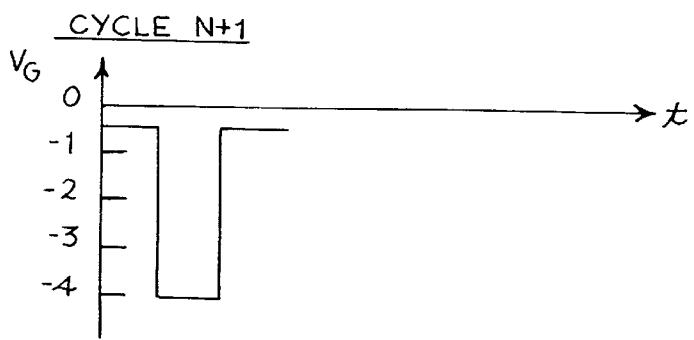
FIG. 9 is an example of two consecutive erase cycles that incorporate an erase sequence according to the present invention for the EEPROM cells of FIGS. 2, 3, 4B and 5.
FIG. 10 is an example of a timing diagram for the two consecutive erase cycles of FIG. 9.

While the above described third technique of erasing provides many advantages, the erase speed degrades or slows down as the cells are subjected to multiple erase cycles. As shown in FIG. 8, the time to erase the cell gradually increases with each successive erase cycle. Without being confined to any particular theory, it is believed that the increase in erase time is due to trapping in the oxide or charge spillover in the nitride layer. To combat the increase in erasure time, the third erase technique described above is applied in each erase cycle. One difference between the third and fourth erase techniques is that the starting erase voltage in each cycle in the fourth technique differs from one another. An example of this fourth technique is shown in FIG. 9 where the Nth erase cycle constitutes four successive pulses according to the third erase technique in order to erase the cell where the first pulse at the gate has a voltage of −1 V, the second pulse having a voltage of −2 V, the third pulse having a voltage of −3 V and the fourth pulse having a voltage of 4 V. After the fourth pulse, the charge trapping region of the memory cell is erased.

After the memory cell is erased during the Nth cycle, an amount of charge substantially equal to the amount of charge present in the memory cell prior to initiation of the Nth erase cycle is written into the charge trapping region of the memory cell. The memory cell is then erased during the N+1$^{st}$ cycle by applying a first negative voltage pulse having a magnitude that is greater than or equal to the final voltage in the previous Nth erase cycle. Thus, a harsher erase cycle is performed during the N+1st cycle than the Nth cycle. The reason behind the above described process is that the number of holes created during the initial pulses of the Nth cycle, such as the −1V, −2V and −3V pulses, may not be significant when compared with the number of pulses created by the latter pulses, such as the −4V pulse. If this the case, the present invention recognizes that it would be inefficient to use in the N+1st cycle those pulses found to be inefficient for erasing in the Nth cycle. Instead, the present invention determines what pulses produce efficient/substantial erasing in the Nth cycle and then starts the next cycle with those pulses. Thus, instead of using four pulses at −1V, −2V, −3V and −4V to erase a cell, it may only take one pulse at −4V to produce the same erasure of the cell. This obviously is more efficient. Subsequent pulses, if needed, are applied to the memory cell during the N+1$^{st}$ cycle in accordance with either the second or third techniques described previously with respect to FIGS. 6 and 7 in order to remove the charge written into the charge trapping region. In the case of the example of FIGS. 9 and 10 only one pulse having a voltage of −4V is needed to remove the charge from the charge trapping region of the memory cell. Subsequent erase cycles are performed in a manner similar in that their initial pulse has a voltage with a magnitude greater than or equal to the voltage of the final pulse of the previous cycle.

Even when the device is programmed to the same threshold voltage, the time to complete the reverse erase is much less than the time to complete the forward erase. The forward erase (i.e. the time to remove the trapped charge associated with a given threshold voltage when the device is read in the forward direction) is slower than the reverse erase (i.e., the time to remove the trapped charge associated with a given threshold voltage when the device is read in the forward direction). In addition, there is residual charge left in the charge trapping region. This is due to the larger wider charge trapping region formed during the forward programming that was required to generate a threshold voltage of 4V. The forward erase is approximately an order of magnitude slower than the reverse erase. For the same amount of charge trapping, the equivalent threshold voltage for reverse reading is much higher than that for forward reading. Reading in the reverse direction requires trapped charge so much smaller than does reading in the forward direction that the erase of the trapped charge is approximately 10 to 20 times faster. Also the cell does not enter deep depletion. This is a huge advantage of the memory cell of FIG. 5 over prior art memory cells especially floating gate cells where over-erase can cause a failure of the memory array due to deep depletion of the charge on the floating gate.

The erase mechanism in the memory cell is self limiting due to the fact that as the memory cell is erased, more and more positive charge is stored in the trapping region 68 (FIG. 5) (for the right bit) of the nitride layer thereby neutralizing the negative charge stored there while the remainder of the nitride layer 20 remains unaffected. Thus, the threshold voltage of the channel keeps dropping until it levels off at the threshold voltage of an unprogrammed memory cell which is the threshold voltage of the larger majority of the channel closer to the source. Over-erasing the memory cell of the present invention only affects (i.e., lowers) the threshold voltage of the portion of the channel under the charge trapping region 68 which is a relatively narrow region while leaving the threshold voltage of the remainder of the channel at its normal value.

As explained previously, a result of reading in the reverse direction is that a narrower charge trapping region is required due to the higher efficiency of the reverse read. Since erasing is always performed through the effective drain region 16 (for trapped charge 68 and region 14 for trapped charge 70), less charge needs to be moved off the charge trapping layer 20 and directed through the drain 16 (charge 68) or effective drain 14 (charge 70). Thus, reading the memory cell 10 in the reverse direction enables much faster erase times. This makes the entire erase process much easier than in prior art memory devices.

Reading the memory device of FIG. 5 in the reverse direction does not just enable simpler and faster erasing, but in fact, if the device is to be read in the forward direction and the trapped charge is so adjusted to give the desired threshold voltage $V_T$, erasing is likely to be not possible at all. This is because much more charge must be trapped on the dielectric 20 beneath the gate 24 to achieve a usable difference in threshold voltage $V_T$ between the programmed and the unprogrammed state when reading in the forward direction than when reading in the reverse direction. This makes erasing the memory device at best difficult if not impossible thus making the forward programming/forward read impractical for this type of memory device which must be erasable.

In terms of optimization, three parameters can be varied to give the quickest programming time and the widest margins. The first parameter is the channel length. A longer channel length, for a given programming time when reading in the reverse direction, increases the distance between the drain and the trapped charge (effectively, the source and drain designations are flipped). This lowers the level of the lateral electric field even lower.

The second parameter is the gate voltage which can be set to minimize the voltage drop in the channel across the channel region beneath the trapped charge. This further reduces the lateral electric field in the channel beneath the trapped charge. Within limits, the voltage in the channel can be 'dialed in' by varying the voltage on the gate. This allows control over the voltage drop in the channel beneath the region of trapped charge. If the gate voltage is made too low then reading a logic '1', i.e., the unprogrammed state, becomes problematic. The gate voltage for reading a logic '1' must be still high enough to generate inversion in order to produce sufficient read current for each sense amplifier. Thus, a lower limit for the gate voltage is approximately 1V above the threshold voltage. The lower limit for the gate voltage is determined by the maximum time required to sense the channel current which represents one state of the memory cell. For example, for fast access time, the maximum time would be in the range of 10 to 30 nanoseconds while for a mass storage device the maximum access time could be as high as 1 microsecond. The actual gate voltage to achieve these maximum times would depend upon the device structure, the dielectric thickness, the bit line capacitance, the doping concentration in the channel and other parameters associated with the device. An upper limit on the gate voltage is the voltage at which the voltage in the channel just beneath the edge of the region of trapped charge is just below the voltage potential applied to the source terminal during reading in the reverse direction. A too high gate voltage will cause inversion in the channel and the benefits of the present invention are lost. Thus, it is not recommended to apply a gate voltage that generates such a high voltage in the channel beneath the edge of the charge trapping region because it defeats the benefits of having a lower potential across the portion of the channel beneath this charge trapping region with the accompanying reduction in leakage current and shortened programming time. The gate voltage used for reading is approximately 3V which represents an optimized tradeoff between programming time and leakage current.

The third optimization method, previously described and which is known in the art, is to vary the boron doping of the channel region under the gate. An increase in the doping concentration results in a higher threshold voltage $V_T$ and a lower voltage generated in the channel. This is due to the reduction in the width of the depletion region formed. Thus a higher doping concentration permits a higher gate voltage to be applied for the same voltage across the portion of the channel beneath the charge trapping region.

In addition, an increase in the $N_A$ doping concentration for the same length trapping region will improve the punch through behavior of the device. By varying the level of boron implanted in the channel region, the width of the depletion region under the gate can be varied. An increase in the doping concentration results in a reduction in the width of the depletion region for the same applied gate voltage. The reduction in the width of the depletion region occurs because there is now more fixed charge in the substrate. Thus, varying the doping concentration can be used to limit the length of the pinchoff region under the gate. In addition, the doping concentration can be used to increase or decrease the initial threshold voltage of the device.

Optimization parameters specific to programming and reading two bits in the memory cell of the present invention will now be described. The optimizations for programming include utilizing a longer minimum effective channel length Leer in order to physically separate the two bits better. In addition, the implant level can be reduced in the channel in order to increase the delta between forward and reverse programming. On the other hand, the implant level can be increased in the channel in order to reduce the impact of the first bit on the programming of the second bit. Thus, the implant level in the channel is a compromise between the forward and reverse delta on the one hand and the programming speed on the other hand.

The optimizations for reading include lowering the gate voltage in order to enhance the punch through during reading. As described previously, punch through is necessary to program and read the second bit. A lower implant level in the channel serves to increase punch through. Also, a higher drain voltage during read functions to increase punch through. These three optimizations relate to reading in the forward direction, which is equivalent to reading the second bit in the reverse.

In addition, a lower gate voltage reduces the number of electrons that need to be injected into the charge trapping region. This improves erasing because it eliminates residual charge remaining trapped after erasure. Any residual charge that remains in the charge trapping layer after erasure degrades cycling.

The foregoing description is provided to illustrate the invention, and is not to be construed as a limitation. Numerous additions, substitutions and other changes can be made to the invention without departing from its scope as set forth in the appended claims.

We claim:

1. A method of erasing a memory cell that comprises a first region and a second region with a channel therebetween and a gate above said channel, and a charge trapping region that contains a first amount of charge, the method comprising:

applying a first voltage across said gate and said first region so that a first portion of said first amount of charge is removed from said charge trapping region;

subsequently applying a second voltage across said gate and said first region so that substantially all remaining portions of said first amount of charge is removed from said charge trapping region, wherein the second voltage is different than said first voltage;

writing a second amount of charge into said charge trapping region; and applying a third voltage across said gate and said first region so that that a first portion of said second amount of charge is removed from said charge trapping region, wherein the magnitude of said third voltage is greater than or equal to the magnitude of said second voltage.

2. The method of claim 1, wherein applying said third voltage causes said second amount of charge to be substantially removed from said charge trapping region.

3. The method of claim 1, wherein said third voltage is equal to said second voltage.

4. The method of claim 1, wherein the first voltage entails having the voltage of said gate being lower than the voltage of said first region.

5. The method of claim 4, wherein the second voltage entails having the voltage of said gate being lower than the voltage of said first region.

6. The method of claim 5, wherein the magnitude of said second voltage is greater than the magnitude of said first voltage.

7. The method of claim 4, wherein the magnitude of said second voltage is greater than the magnitude of said first voltage.

8. The method of claim 1, wherein the second voltage entails having the voltage of said gate being lower than the voltage of said first region.

9. The method of claim 1, wherein the magnitude of said second voltage is greater than the magnitude of said first voltage.

10. The method of claim 1, wherein the voltage of said first region remains unchanged during said steps of applying a first voltage and a second voltage.

11. The method of claim 1, comprising reading the memory cell subsequent to the step of applying the first voltage and prior to the step of applying the second voltage.

12. The method of claim 11, wherein said reading of the memory cell determines whether or not said memory cell is erased.

13. The method of claim 12, wherein if said reading of the memory cell determines that said memory cell is erased, then said step of applying a second voltage is not performed.

14. The method of claim 1, wherein said first amount of charge substantially equals said second amount of charge.

15. The method of claim 1, wherein said memory cell comprises an EEPROM memory cell.

16. The method of claim 15, wherein said memory cell comprises a flash EEPROM memory cell.

17. The method of claim 15, wherein said memory cell comprises a two bit memory cell.

18. The method of claim 17, wherein said memory cell comprises a two bit memory cell.

19. The method of claim 1, wherein said memory cell comprises a two bit memory cell.

20. The method of claim 1, wherein said memory cell comprises: a P-type substrate;
a dielectric layer that lies between said channel and said charge trapping region.

21. The method of claim 20, wherein said memory cell further comprises an electrical isolation layer located above said channel.

22. The method of claim 20, wherein said dielectric layer comprises silicon dioxide.

23. The method of claim 20, wherein said charge trapping layer comprises silicon nitride.

24. A method of erasing a memory cell that comprises a first region and a second region with a channel therebetween and a gate above said channel, and a charge trapping region that contains a first amount of charge, the method comprising:

applying a first cycle of voltages across said gate and said first region so that said first amount of charge is removed from said charge trapping region;

writing a second amount of charge into said charge trapping region; and subsequently applying a second cycle of one or more voltages across said gate and said first region so that said second amount of charge is removed from said charge trapping region, wherein the initial applied voltage of said second cycle of voltages is equal to the final applied voltage of said first cycle.

25. The method of claim 24, wherein the initial applied voltage of said first cycle of voltages is different than the final applied voltage of said first cycle of voltages.

26. The method of claim 25, wherein the magnitude of said final applied voltage of said first cycle of voltages is greater than the magnitude of said initial applied voltage of said first cycle of voltages.

27. The method of claim 25, wherein each voltage applied during said first cycle of voltages is different than all other voltages applied during said first cycle of voltages.

28. The method of claim 27, wherein the magnitudes of said first cycle of voltages sequentially increases from said initial applied voltage of said first cycle of voltages to said final applied voltage of said first cycle of voltages.

29. The method of claim 24, wherein each of said voltages of said first cycle of voltages has the voltage of said gate being lower than the voltage of said first region.

30. The method of claim 29, wherein each of said one or more voltages of said second cycle of voltages has the voltage of said gate being lower than the voltage of said first region.

31. The method of claim 24, wherein each of said one or more voltages of said second cycle of voltages has the voltage of said gate being lower than the voltage of said first region.

32. The method of claim 24, wherein said first amount of charge substantially equals said second amount of charge.

33. The method of claim 24, wherein said memory cell comprises an EEPROM memory cell.

34. The method of claim 33, wherein said memory cell comprises a flash EEPROM memory cell.

35. The method of claim 33, wherein said memory cell comprises a two bit memory cell.

36. The method of claim 24, wherein said memory cell comprises a two bit memory cell.

37. The method of claim 36, wherein said memory cell comprises a two bit memory cell.

38. The method of claim 24, wherein said memory cell comprises: a P-type substrate;
a dielectric layer that lies between said channel and said charge trapping region.

39. The method of claim 38, wherein said memory cell further comprises an electrical isolation layer located above said channel.

40. The method of claim 38, wherein said dielectric layer comprises silicon dioxide.

41. The method of claim 38, wherein said charge trapping layer comprises silicon nitride.

* * * * *